United States Patent
Gilliam et al.

(10) Patent No.: US 6,172,924 B1
(45) Date of Patent: *Jan. 9, 2001

(54) MEMORY DEVICE WITH A SENSE AMPLIFIER

(75) Inventors: Gary R. Gilliam; Steve G. Renfro; Kacey Cutler; Roland Ochoa; Craig E. Schneider, all of Boise, ID (US)

(73) Assignee: Micron Technology, Inc., Boise, ID (US)

( * ) Notice: Under 35 U.S.C. 154(b), the term of this patent shall be extended for 0 days.

This patent is subject to a terminal disclaimer.

(21) Appl. No.: 09/497,295

(22) Filed: Feb. 3, 2000

Related U.S. Application Data

(60) Continuation of application No. 09/137,636, filed on Aug. 20, 1998, which is a division of application No. 08/915,271, filed on Aug. 22, 1997, now Pat. No. 5,901,099, which is a division of application No. 08/783,573, filed on Jan. 15, 1997, now Pat. No. 5,744,978, which is a continuation of application No. 08/619,808, filed on Mar. 15, 1996, now Pat. No. 5,627,785.

(51) Int. Cl.[7] ............................................. G11C 7/02
(52) U.S. Cl. ................................. 365/207; 365/226
(58) Field of Search .................................... 365/205, 207, 365/208, 190, 226

(56) References Cited

U.S. PATENT DOCUMENTS

| | | | |
|---|---|---|---|
| 4,460,985 | 7/1984 | Hoffman | 365/207 |
| 4,609,832 | 9/1986 | Mehl | 307/270 |
| 4,929,853 | 5/1990 | Kim et al. | 307/475 |
| 4,988,897 | 1/1991 | Jeong | 307/475 |
| 5,220,221 | 6/1993 | Casper | 307/530 |
| 5,305,263 | 4/1994 | Morgan | 365/190 |
| 5,305,275 | 4/1994 | Yamashita et al. | 365/226 |
| 5,373,227 | 12/1994 | Keeth | 323/313 |
| 5,418,747 | 5/1995 | Tobita | 365/194 |
| 5,420,823 | 5/1995 | Yonaga et al. | 365/226 |
| 5,438,280 | 8/1995 | Sugawara | 326/71 |
| 5,502,400 | 3/1996 | Livolsi et al. | 326/30 |
| 5,532,617 | 7/1996 | Parkinson et al. | 326/32 |
| 5,532,620 | 7/1996 | Seo et al. | 326/81 |
| 5,627,785 | 5/1997 | Gilliam et al. | 365/189.01 |
| 5,744,978 | 4/1998 | Gilliam et al. | 326/31 |

*Primary Examiner*—Trong Phan
(74) *Attorney, Agent, or Firm*—Schwegman, Lundberg, Woessner & Kluth, P.A.

(57) ABSTRACT

A circuit for a sense amplifier (14) for use with a memory device (10). The circuit includes two devices (40 and 42) that are controlled by a selector (44). The first device (40) drives the sense amplifier (14) with a first current level. The second device (42) drives the sense amplifier (14) with a second current level, different from the first current level. The selector (44) is coupled to the first and second devices (40 and 42) so as to selectively couple one of the first and second devices (40 and 42) to the sense amplifier (14) based on a power supply voltage of the memory device (10).

75 Claims, 2 Drawing Sheets

MEMORY DEVICE WITH A SENSE AMPLIFIER

TECHNICAL FIELD OF THE INVENTION

This application is a continuation of U.S. Ser. No. 09/137,636, filed Aug. 20, 1998, which is a divisional of Ser. No. 08/915,271 is now filed Aug. 22, 1997 U.S. Pat. 5,901,099, issued May 4, 1999, which is a divisional of Ser. No. 08/783,573 filed Jan. 15, 1997 is now U.S. Pat. No. 5,744,978, issued Apr. 28, 1998, which is a continuation of Ser. No. 08/619,808 is now U.S. Pat. No. 5,627,785, filed Mar. 15, 1996 and issued May 6, 1997.

TECHNICAL FIELD OF THE INVENTION

The present invention relates generally to electronic circuits and in particular to a memory device with a sense amplifier.

BACKGROUND OF THE INVENTION

In the electronics industry, device manufacturers design and produce commodity parts that are capable of operating in a variety of electronic systems that have different electronic specifications. For example, dynamic random access memory (DRAM) devices are designed for use in electronic systems with a wide range of power supply voltage. To keep pace with changes in system specifications, device manufacturers face the difficult task of designing new parts that operate over a wider range of conditions.

A DRAM device is comprised of an array of individual memory cells. Typically, each memory cell comprises a capacitor capable of holding a charge and an access transistor for accessing the capacitor charge. The charge is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output lines through transistors used as switching devices. For each bit of data stored, its true logic state is available on an I/O line and its complementary logic state is available on an I/O complement line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memory devices use memory cells fabricated as capacitors in an integrated circuit to store data. That is, a logical "1" is stored as a charge on the capacitor and the capacitor is discharged for a logical "0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading the memory cells or writing thereto.

Typically, a sense amplifier includes a pair of n-channel transistors having a cross-coupled gate and drain configuration. Due to the positive feedback of this configuration, the sense amplifier senses slight changes in the voltages on the digit and digit complement lines and produces full logic values on the digit lines based on the slight voltage differential. The source of each transistor is coupled to a pull down device, which, in operation drives the source of the transistors to ground thus allowing the sense amplifier to amplify the small changes in voltage on the digit and digit complement lines.

Conventionally, the pull down device of an n-channel sense amplifier comprises an n-channel MOS transistor. Unfortunately, conventional pull down devices do not function properly over the wider range of power supply voltages demanded by newer systems. At low supply voltages, the current in a typical pull down device is not sufficient to allow the sense amplifier to settle quick enough to produce an accurate reading at the digit lines. Further, at high power supply voltages, the pull down device draws too much current and drives the common source and the drains of both transistors to ground before the digit lines can reach the proper voltages.

For the reasons stated above, and for other reasons stated below which will become apparent to those skilled in the art upon reading and understanding the present specification, there is a need in the art for a memory device which functions properly over a wide range of power supply voltage.

SUMMARY OF THE INVENTION

A memory device with a sense amplifier is described which operates acceptably over a wide range of power supply voltages. In one embodiment, the present invention describes a circuit for a sense amplifier for use with a memory device that is operable over varied power supply voltages. The circuit includes two devices that are controlled by a selector. The first device drives the sense amplifier with a first current level. The second device drives the sense amplifier with a second current level, different from the first current level. The selector is coupled to the first and second devices so as to selectively couple devices to the sense amplifier based on a power supply voltage of the memory device.

In one embodiment the devices are n-channel MOS transistors that function as pull-down devices for an n-sense amplifier. The pull-down devices may have different widths so as to drive the sense amplifier with different current levels. Alternatively, the pull-down devices may have similar widths and be selectively coupled alone or in combination to the sense amplifier to produce an acceptable current to drive the sense amplifier.

In further embodiments, the selector comprises a Schmitt trigger that produces a signal that selectively activates the devices based on the power supply voltage. The Schmitt trigger receives a signal that is proportional to the supply voltage and compares the signal with a threshold value of the Schmitt trigger. In further embodiments, the selector circuit comprises logic gates coupled between the Schmitt trigger and the first and second devices so as to produce signals to selectively activate the devices.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense.

Figure 1:
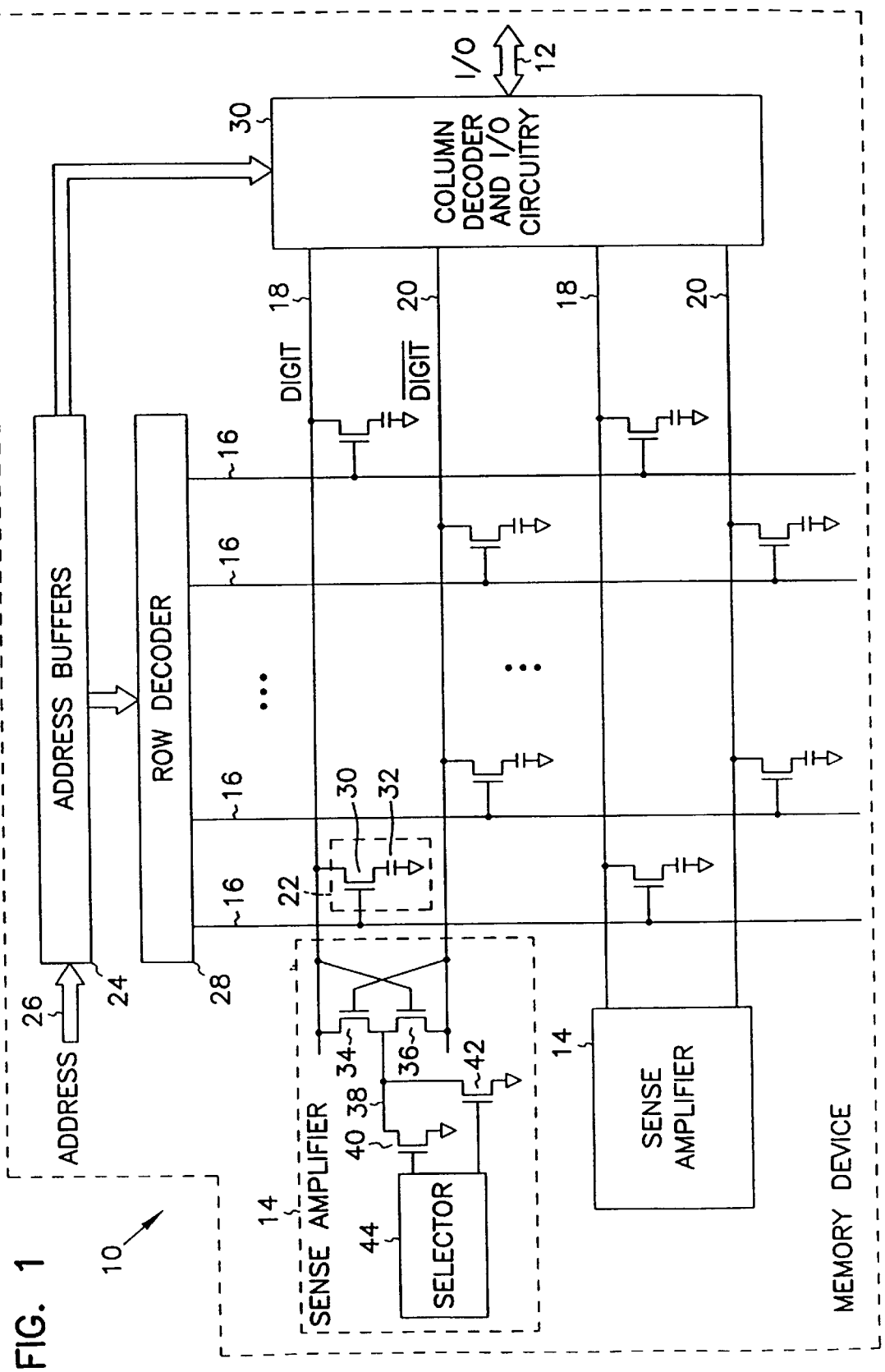
FIG. 1 is a schematic diagram of an illustrative embodiment of the present invention.

FIG. 1 is a schematic diagram of a memory device, indicated generally at 10. Device 10 uses dual or folded digit lines to transfer data to and from memory cells via input/output (I/O) port 12. Device 10 includes row lines 16, digit lines 18, and digit complement lines 20. A memory cell 22 is coupled to each row 16 at the intersection with either a digit line 18 or a digit complement line 20. Sense amplifiers 14 are coupled to a corresponding pair of digit line 18 and digit complement line 20. The operation of device 10 is not tied to the folded digit line configuration shown in FIG. 1. Device 10 may, alternatively, use an open digit line or other appropriate configuration for the array of memory cells that can be accessed through sense amplifiers 14.

Device 10 further includes circuitry that selects a memory cell 22 from device 10 to receive input or provide output to an external device such as a microprocessor (not shown) at I/O port 12. Address buffers 24 receive an address at input port 26 from the external device. Address buffers 24 are coupled to row decoder 28 and column decoder 30. Column decoder 30 includes input-output circuitry that is coupled to the external device at I/O port 12. Row decoder 28 is coupled to rows 16. Column decoder 30 is coupled to digit lines 18 and digit complement lines 20.

Each sense amplifier 14 includes first and second n-channel MOS transistors 34 and 36 in a cross coupled configuration so as to form a basic flip-flop. A source of transistor 34 is coupled to a source of transistor 36 at node 38. A gate of transistor 34 is coupled to digit complement line 20 and a gate of transistor 36 is coupled to digit line 18. A drain of transistor 34 is coupled to digit line 18. A drain of transistor 36 is coupled to digit complement line 20. First and second pull down devices 40 and 42 are coupled to node 38 so as to drive sense amplifier 14. First and second pull-down devices 40 and 42 comprise n-channel MOS transistors each having a drain coupled to node 38 and a source coupled to ground. Selector circuit 44 is coupled to a gate of each of pull-down devices 40 and 42 so as to selectively activate either pull-down device 40 or pull-down device 42. Advantageously, pull-down devices 40 and 42 have different widths so as to provide acceptable pull-down capabilities for sense amplifier 14 at different power supply voltages.

In operation, device 10 receives an address of a selected cell at address buffers 24. Address buffers 24 identify a row 16 of a selected cell 22 to row decoder 28. Row decoder 28 provides a voltage on line 16 to activate access transistors 30 of each cell 22 in the selected row 16. The charge on the capacitor 32 is coupled to one of the digit lines 18 or digit complement lines 20. Sense amplifier 14 senses a slight difference between the voltage on digit line 18 and the voltage on digit complement line 20 of the selected cell 22 and drives digit line 18 and digit complement line 20 to the value of the power supply rails.

Sense amplifier 14 assures proper operation over a wide range of power supply voltages by selectively coupling either first or second pull-down devices 40 and 42 to node 38. At a high power supply voltage, selector 44 couples pull-down device 42 to node 38 when data is ready to be written to or read from cell 22. Pull-down device 42 is fabricated with a width that is less than the width of pull-down device 40 such that pull-down device 42 draws a sufficiently low current that allows transistors 34 and 36 sufficient time to determine the content of the selected cell 22.

At low power supply voltage, selector 44 couples pull-down device 40 to node 38 when data is ready to be written to or read from cell 22. Pull-down device 40 is fabricated with a width that is, for example, approximately twice as big as pull-down device 42. Thus, pull-down device 40 draws a sufficiently high current so as to assure that transistors 34 and 36 operate fast enough to accurately write data to or read data from a selected cell 22. Therefore, by using two pull-down devices, a manufacturer can produce memory devices that function properly over a wider range of power supply voltage.

Figure 2:
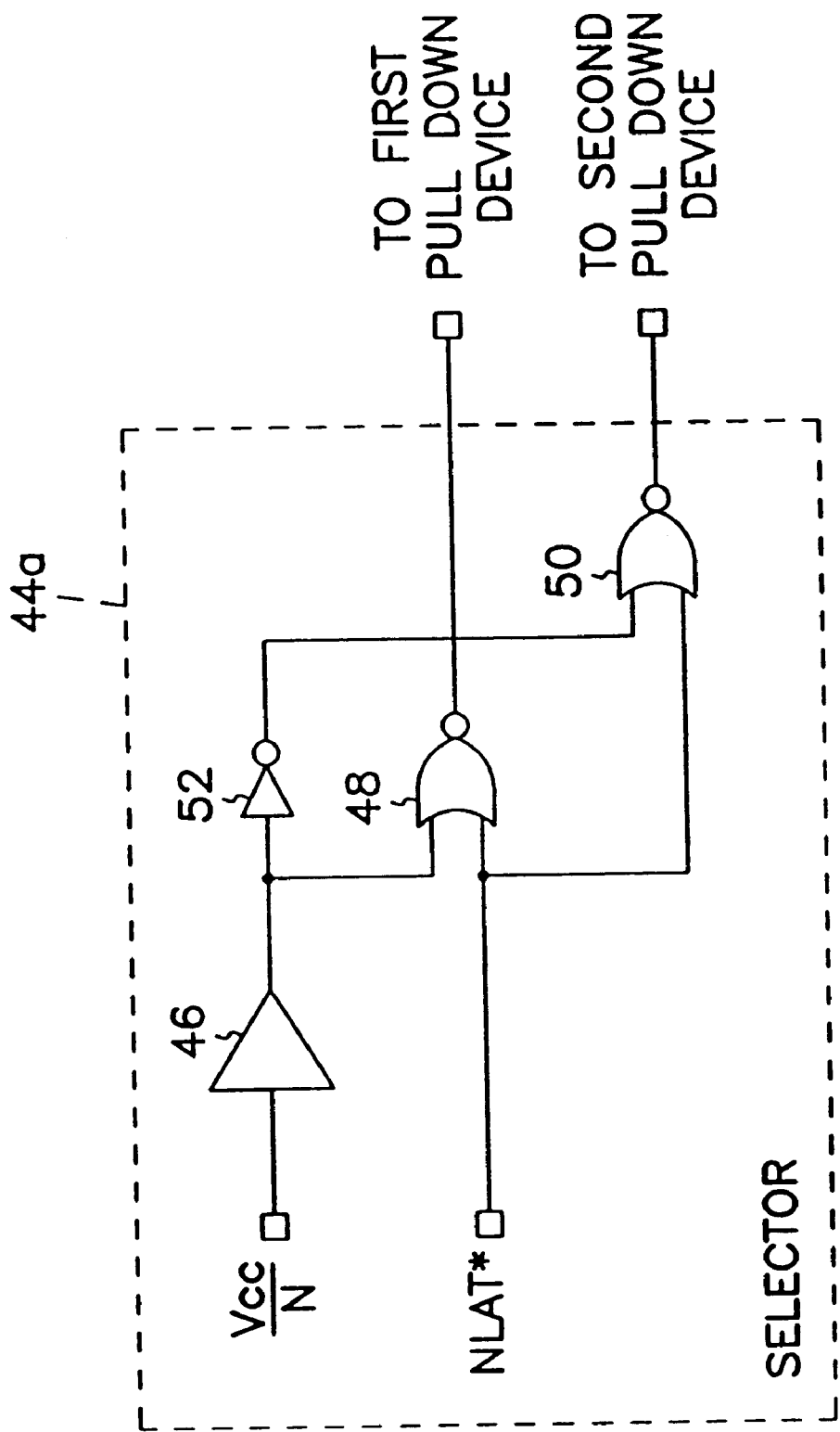
FIG. 2 is a schematic diagram of an embodiment of a selector logic circuit for use with the embodiment of FIG. 1.

FIG. 2 is a block diagram of an illustrative embodiment of a selector, indicated generally at 44a. Selector 44a selects between first and second pull down devices 40 and 42 of sense amplifier 14 based on the power supply voltage. Selector 44a comprises a Schmitt trigger 46 that receives a voltage that is proportional to the power supply voltage; labelled as $V_{CC}/N$. This voltage may be supplied by either an existing node of a memory device or generated with circuitry as known to a person of ordinary skill in the art. In some memory devices, a node exists that is established at one-half of the power supply. This node may be advantageously used as an input to the Schmitt trigger. Selector 44a further includes first and second NOR-gates 48 and 50 and inverter 52. The output of schmitt trigger 46 is coupled to a first input of NOR-gate 48 and an input of inverter 52. The output of inverter 52 is coupled to a first input of NOR-gate 50. Finally, a latch signal, NLAT*, is coupled to a second input of both NOR-gate 48 and NOR-gate 50.

In operation, selector 44a selects first pull-down device 40 when the power supply voltage is low and selects second pull-down device 42 when the power supply voltage is high. Schmitt trigger 46 receives a signal that is proportional to the power supply voltage. The threshold of Schmitt trigger 44a and its input are selected such that for high power supply voltages, Schmitt trigger 46 outputs a high logic value and for low power supply voltages, Schmitt trigger 46 outputs a low logic value.

When the input to Schmitt trigger 46 exceeds a threshold value, Schmitt trigger 46 outputs a high logic value to inverter 52 which produces a low logic value. In response, NOR-gate 50 produces a high logic output when the latch signal goes low which turns on second pull-down device 42. Thus, selector 44a selects second pull-down device 42 when the power supply voltage is high.

When the input to Schmitt trigger 46 does not exceed the threshold value, schmitt trigger 46 outputs a low logic value. In response, NOR-gate 48 produces a high logic output when the latch signal goes low which turns on first pull down device 40. Thus, selector 44a selects first pull-down device 40 when the power supply voltage is low. Due to the differing widths of first and second pull down devices 40 and 42, selector 44a allows sense amplifier 14 to function properly over a wide range of power supply voltage by activating a pull down device that will draw an appropriate current from sense amplifier 14.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the sense amplifier is not limited to use with a folded digit line configuration. For example, open digit line or other conventional configurations may be used. Further, selector 44 can be modified with different logic circuitry so long as the circuitry allows selector 44 to select between the pull-down devices based on the power supply voltage.

The arrangement of pull down devices 40 and 42 can be varied without departing from the spirit and scope of the invention. For example, devices 40 and 42 can be fabricated in various proportions so long as the devices provide acceptable current levels over the specified power supply voltage range. For example, first and second pull-down devices 40 and 42 can be replaced by two transistor with similar widths. In this case, selector 44 coupled one of the transistors to drive the sense amplifier when the power supply provides a high voltage. When the power supply voltage is low, the selector couples both of the transistors to drive the sense amplifier.

Sense amplifier 14 of FIG. 1 is shown as an n-sense amplifier. As is known in the art, sense amplifier 14 can also include a p-sense amplifier such that the n-sense and p-sense amplifiers are fired in turn to read from or write to a memory cell. The n-sense amplifier drives a digit line 18 or digit complement line 20 to a the low power supply rail and the p-sense amplifier drives the other of digit line 18 and digit complement line 20 to the value of the high power supply rail. In conventional operation, either the p-sense amplifier or the n-sense amplifier is fired first. A further embodiment of the present invention includes a p-sense amplifier first and second pull-up devices that are selectively coupled to drive the p-sense amplifier based on the power supply voltage. Thus, the p-sense amplifier can be fired before the n-sense amplifier and the sense amplifier will operate acceptably over a wide range of power supply voltages.

What is claimed is:

1. A method of driving a circuit for a sense amplifier in a memory device, wherein the sense amplifier is operable over a range of power supply voltages, the method comprising:

driving the sense amplifier with a first device having a first current level;

driving the sense amplifier with a second device having a second current level; and selectively coupling the first and second devices to the sense amplifier with a selector, wherein selectively coupling is based on the power supply voltage of the memory device.

2. The method of claim 1, wherein driving the sense amplifier with a first device and driving the sense amplifier with a second device comprises driving the sense amplifier with a first device and a second device comprising n-channel MOS transistors that have different widths, wherein a gate of each transistor is coupled to receive a control signal from the selector.

3. The method of claim 2, wherein driving the sense amplifier with a first device and a second device comprises driving the sense amplifier with a first device and a second device, wherein the first device is approximately twice as wide as the second device.

4. The method of claim 1, wherein selectively coupling the first and second devices comprises selectively coupling the first and second devices to the sense amplifier with a selector coupled to the first and second devices, wherein the selector comprises a selector logic circuit having a Schmitt trigger which produces a signal that selectively activates the first and second devices so as to produce an acceptable drive current level for the sense amplifier.

5. The method of claim 4, further comprising:

receiving a selection signal at an input of the Schmitt trigger; and comparing the selection signal with a threshold value of the Schmitt trigger.

6. The method of claim 5, further comprising:

driving the sense amplifier with a first logic gate coupled between the Schmitt trigger and the first device when the selection signal is below the threshold value; and driving the sense amplifier with a second logic gate coupled between the Schmitt trigger and the second device when the selection signal is above the threshold value.

7. The method of claim 6, wherein driving the sense amplifier with a first logic gate comprises driving the sense amplifier with a NOR-gate having a first input coupled to an output of the Schmitt trigger and a second input coupled to a latch signal for the sense amplifier; and wherein driving the sense amplifier with a second logic gate comprises driving the sense amplifier with a second NOR-gate having a first input coupled to an inverted output of the Schmitt trigger and a second input coupled to the latch signal for the sense amplifier.

8. The method of claim 1, wherein driving the sense amplifier with a first device and a second device comprises driving the sense amplifier with a first pull-down device and a second pull-down device in an n-sense amplifier.

9. A method of operating a variable load device under varied power supply voltages of a circuit, the method comprising:

conveying a first current level with a first device;

conveying a second current level, different from the first current level, with a second device; and selectively enabling the first and second devices based on the power supply voltage with a selector coupled to the first and second devices.

10. The method of claim 9, wherein conveying a first current level with a first device and conveying a second current level with a second device comprises conveying a first current level and conveying a second current level with n-channel MOS transistors that have different widths, wherein a gate of each transistor is coupled to receive a control signal from the selector.

11. The method of claim 9, wherein selectively enabling the first and second devices with a selector comprises selectively activating the first and second devices with a signal produced by a Schmitt trigger so as to produce an acceptable drive current level for a sense amplifier.

12. The method of claim 11, further comprising:

receiving a selection signal with the Schmitt trigger, wherein the selection signal is proportional to the supply voltage; and comparing the selection signal with a threshold value of the Schmitt trigger.

13. A method of driving a sense amplifier comprising:
  determining a voltage level related to a voltage level of a power supply of the memory device;
  driving the sense amplifier with a first current level when the power supply voltage is below a threshold; and
  driving the sense amplifier with a second current level, different from the first current level, when the power supply voltage is above the threshold.

14. The method of claim 13, wherein determining a voltage level of a power supply comprises determining a voltage level of a power supply with a Schmitt trigger, wherein the Schmitt trigger determines when the power supply exceeds a threshold.

15. The method of claim 13, wherein driving the sense amplifier with a first current level and driving the sense amplifier with a second current level comprises driving the sense amplifier with a first current of a first transistor and driving the sense amplifier with a second current of a second transistor, wherein the first and second transistors are sized to conduct different current levels.

16. A method of activating a sense amplifier for a memory device, the method comprising:
  conducting different current levels with first and second n-channel transistors when the sense amplifier is activated, wherein the transistors have different widths;
  producing a voltage level at a voltage node that is proportional to the voltage level of a power supply for the sense amplifier;
  coupling an input signal of a Schmitt trigger circuit to the voltage node;
  producing control signals that activate the first transistor when the voltage of the power supply is below a threshold and that activate the second transistor when the voltage of the power supply is above the threshold, wherein producing the control signals comprises producing the control signals with a logic circuit which is coupled between an output of the Schmitt trigger and the first and second n-channel transistors.

17. The method of claim 16, wherein producing the control signals with a logic circuit comprises producing the control signals with a logic circuit which is coupled to a latch signal, wherein the latch signal selects when the control signals are applied to the first and second n-channel transistors.

18. A method of operating a sense amplifier, for use with a memory device, under varied power supply voltages, wherein the sense amplifier comprises first and second transistors that are cross-coupled between digit lines of the memory device and a number of drive devices coupled to the first and second transistors, the method comprising selectively coupling the number of drive devices to the sense amplifier with a selector coupled to the drive devices, wherein selectively coupling is based on the power supply voltage of the memory device so as to drive the sense amplifier with a sufficient current level.

19. The method of claim 18, wherein selectively coupling the number of drive devices comprises selectively coupling a number of n-channel MOS transistors, each transistor having a gate coupled to receive a control signal from the selector.

20. The method of claim 19, wherein selectively coupling a number of n-channel MOS transistors comprises selectively coupling a number of n-channel MOS transistors having different widths.

21. The method of claim 18, wherein selectively coupling the number of drive devices with a selector comprises selectively coupling the number of drive devices with a Schmitt trigger that produces a signal that selectively activates the drive devices so as to produce an acceptable drive current level for the sense amplifier.

22. The method of claim 21, further comprising receiving a selection signal by the Schmitt trigger that is proportional to the supply voltage and wherein the Schmitt trigger compares the selection signal with a threshold value of the Schmitt trigger.

23. A method of operating a sense amplifier, for use with a memory device, under varied power supply voltages, wherein the sense amplifier comprises first and second transistors that are cross-coupled between digit lines of the memory device and a first number of drive devices, first and second p-channel transistors that are cross-coupled between the digit lines, a second number of drive devices coupled to the p-channel transistors, wherein the first number of drive devices are coupled to the first and second transistors, the method comprising:
  selectively driving the first number of drive devices to the sense amplifier based on the power supply voltage of the memory device so as to drive the sense amplifier with a sufficient current level; and
  selectively driving the second number of drive devices to the p-channel transistors based on the power supply voltage of the memory device so as to drive the p-channel transistors with a sufficient current level.

24. A method of driving a sense amplifier for a memory device, wherein the sense amplifier includes first and second transistors that are cross-coupled between digit lines of the memory device, a number of drive transistors which are coupled to the first and second cross-coupled transistors and a Schmitt trigger circuit having an input, the method comprising:
  producing a voltage level at a voltage node coupled to the input of the Schmitt trigger, wherein the voltage level is proportional to the voltage level of a power supply for the sense amplifier; and
  producing control signals with a logic circuit, wherein the control signals selectively activate the drive transistors based on the voltage of the power supply, wherein the logic circuit is coupled between an output of the Schmitt trigger and the first and second drive transistors.

25. The method of claim 24, further comprising selecting when the control signals are applied to the drive transistors with a latch signal which is coupled to an input of the logic circuit.

26. A method of driving a sense amplifier for a memory device, wherein the sense amplifier includes first and second n-channel MOS transistors that are cross-coupled between digit lines of the memory device, a number of drive transistors which are coupled to the first and second cross-coupled transistors and a Schmitt trigger circuit having an input, the method comprising:
  producing a voltage level at a voltage node coupled to the input of the Schmitt trigger, wherein the voltage level is proportional to the voltage level of a power supply for the sense amplifier; and
  producing control signals with a logic circuit, wherein the control signals selectively activate the drive transistors based on the voltage of the power supply, wherein the logic circuit is coupled between an output of the Schmitt trigger and the first and second drive transistors.

27. The method of claim 26, further comprising selecting when the control signals are applied to the drive transistors with a latch signal which is coupled to an input of the logic circuit.

28. A method of driving a sense amplifier for a memory device, wherein the sense amplifier includes a Schmitt trigger circuit having an input, first and second transistors having different widths and a number of drive transistors which are coupled to the first and second transistors, wherein the first and second transistors are cross-coupled between digit lines of the memory device, the method comprising:

producing a voltage level at a voltage node coupled to the input of the Schmitt trigger, wherein the voltage level is proportional to the voltage level of a power supply for the sense amplifier; and producing control signals that selectively activate the drive transistors based on the voltage of the power supply with a logic circuit, wherein the logic circuit is coupled between an output of the Schmitt trigger and the first and second drive transistors.

29. The method of claim 28, further comprising selecting when the control signals are applied to the drive transistors with a latch signal which is coupled to an input of the logic circuit.

30. A method of driving a sense amplifier for a memory device, wherein the sense amplifier includes first and second transistors that are cross-coupled between digit lines of the memory device, a number of drive transistors, first and second p-channel transistors that are cross-coupled between the digit lines, a number of drive devices, a Schmitt trigger circuit and wherein the number of drive transistors are coupled to the first and second cross-coupled transistors, the method comprising:

producing a voltage level at a voltage node coupled to an input of the Schmitt trigger circuit, wherein the voltage level is proportional to the voltage level of a power supply for the sense amplifier;

producing control signals that selectively activate the drive transistors based on the voltage of the power supply with a logic circuit, wherein the logic circuit is coupled between an output of the Schmitt trigger circuit and the first and second drive transistors; and selectively coupling the number of drive devices to the p-channel transistors based on the power supply voltage of the memory device so as to drive the p-channel transistors with a sufficient current level.

31. A method of sensing voltage with a sense amplifier for a memory device, wherein the memory device includes a plurality of storage cells that are addressably coupled to row lines and digit lines, the method comprising:

selecting a row for a storage cell with row addressing circuitry;

selecting a digit line for the storage cell with digit line addressing circuitry; and detecting the voltage stored in the selected storage cell with a sense amplifier, wherein the sense amplifier includes a variable load that is adjusted based on the supply voltage of the memory device.

32. The method of claim 31, wherein detecting the voltage stored in the selected storage cell with a sense amplifier comprises detecting the voltage stored in the selected storage cell with a sense amplifier, wherein the sense amplifier includes a variable load which includes a number of load elements that are selectively coupled to the sense amplifier based on the supply voltage.

33. The method of claim 31, wherein detecting the voltage stored in the selected storage cell with a sense amplifier comprises detecting the voltage stored in the selected storage cell with a sense amplifier, wherein the sense amplifier includes first and second n-channel transistors.

34. The method of claim 31, wherein detecting the voltage stored in the selected storage cell with a sense amplifier comprises detecting the voltage stored in the selected storage cell with a sense amplifier, wherein the sense amplifier includes first and second n-channel transistors having first and second different widths, respectively.

35. The method of claim 33, further comprising comparing a voltage proportional to the supply voltage to a reference voltage with a selector circuit.

36. The method of claim 33, further comprising comparing a voltage proportional to the supply voltage to a reference voltage with a selector circuit, wherein the selector circuit includes a Schmitt trigger.

37. A method selecting load devices with a sense amplifier of a memory device, wherein the memory device includes a plurality of storage cells that are addressably coupled to row lines and digit lines, the method comprising:

selecting a storage cell with a row decoder which is coupled to the row lines;

selecting a digit line for the selected storage cell with a column decoder which is coupled to the digit lines; and activating selected load devices based on a voltage level with a selector of a sense amplifier, wherein the sense amplifier includes transistors cross-coupled between a pair of digit lines and a number of load devices which are coupled to the cross-coupled transistors.

38. The method of claim 37, wherein activating selected load devices based on a voltage level with a selector of a sense amplifier comprises activating selected load devices based on a voltage level with a selector of a sense amplifier, wherein the sense amplifier includes transistors cross-coupled between a pair of digit lines and a number of load devices, wherein the cross-coupled transistors include a pair of cross-coupled n-channel transistors and a pair of cross-coupled p-channel transistors.

39. The method of claim 37, wherein activating selected load devices based on a voltage level with a selector of a sense amplifier comprises activating selected load devices based on a voltage level with a selector of a sense amplifier, wherein the sense amplifier includes transistors cross-coupled between a pair of digit lines and a number of n-channel transistors.

40. The method of claim 37, wherein activating selected load devices based on a voltage level with a selector of a sense amplifier comprises activating selected load devices based on a voltage level with a selector of a sense amplifier, wherein the sense amplifier includes transistors cross-coupled between a pair of digit lines and a pair of n-channel transistors having different widths.

41. The method of claim 37, wherein activating selected load devices based on a voltage level with a selector of a sense amplifier comprises activating selected load devices based on a voltage level with a selector of a sense amplifier, wherein the selector includes a Schmitt trigger that compares a voltage proportional to the supply voltage with a reference voltage.

42. The method of claim 37, wherein activating selected load devices based on a voltage level with a selector of a sense amplifier comprises activating selected load devices based on a voltage level with a selector of a sense amplifier, wherein the selector includes a Schmitt trigger that compares a voltage proportional to the supply voltage with a reference voltage and produces a signal that selects among the number of load devices to provide a selected current level for the sense amplifier.

43. The method of claim 37, wherein activating selected load devices based on a voltage level with a selector of a sense amplifier comprises activating selected load devices based on a voltage level with a selector of a sense amplifier, wherein the selector includes a Schmitt trigger coupled to a logic circuit that controls the number of load devices, wherein the Schmitt trigger compares a voltage proportional to the supply voltage with a reference voltage.

44. A method of driving a sense amplifier of a memory device, wherein the memory device includes a plurality of storage cells that are addressably coupled to row lines and digit lines, the method comprising:
   selecting a storage cell with a row decoder coupled to the row lines;
   selecting a digit line for the selected storage cell with a column decoder coupled to the digit lines; and
   driving the sense amplifier, wherein driving the sense amplifier comprises,
      determining a voltage level related to a voltage level of a power supply of the memory device;
      driving the sense amplifier with a first current level when the voltage level is below a threshold; and
      driving the sense amplifier with a second current level, different from the first current level, when the voltage level is above the threshold.

45. The method of claim 44, wherein determining a voltage level comprises determining a voltage level with a Schmitt trigger, wherein the Schmitt trigger determines when the voltage level exceeds a threshold.

46. The method of claim 44, wherein driving the sense amplifier with a first current level and a second current level comprises driving the sense amplifier with a first current level and a second current level with first and second transistors, respectively, that are sized to conduct different current levels.

47. The method of claim 44, wherein driving the sense amplifier with a first current level and a second current level comprises driving the sense amplifier with a first current level and a second current level with a number of transistors that are each sized to conduct substantially the same current level.

48. The method of claim 44, wherein determining a voltage level comprises determining a voltage level with a Schmitt trigger, wherein the Schmitt trigger compares a voltage proportional to the voltage level of the power supply voltage with a reference voltage level.

49. A method of driving a sense amplifier of a memory device, wherein the memory device includes a plurality of storage cells each coupled to a row line and a column line, the method comprising:
   selecting a row for a storage cell with row addressing circuitry;
   selecting a column for the selected storage cell with column addressing circuitry;
   detecting the voltage stored in the selected storage cell with a sense amplifier;
   driving the sense amplifier with a first current level of a first device;
   driving the sense amplifier with a second current level of a second device; and
   selectively coupling one of the first and second devices to the sense amplifier with a selector, wherein selectively coupling is based on a power supply voltage of the memory device.

50. The method of claim 49, wherein driving the sense amplifier with a first current level of a first device and driving the sense amplifier with a second current level of a second device comprises driving the sense amplifier with a first current level and a second current level of n-channel MOS transistors having different widths, wherein a gate of each transistor is coupled to receive a control signal from the selector.

51. The method of claim 49, wherein selectively coupling one of the first and second devices to the sense amplifier with a selector comprises selectively coupling one of the first and second devices to the sense amplifier with a Schmitt trigger, wherein the Schmitt trigger produces a signal that indicates which of the first and second devices will produce an acceptable drive current level for the sense amplifier.

52. The method of claim 51, further comprising:
   receiving a selection signal that is proportional to the supply voltage at an input of the Schmitt trigger and wherein the Schmitt trigger compares the selection signal with a threshold value.

53. The method of claim 52, further comprising:
   driving the sense amplifier when the selection signal is below the threshold value with a first logic gate of the selector, wherein the first logic gate is coupled between the Schmitt trigger and the first device; and
   driving the sense amplifier when the selection signal is above the threshold value with a second logic gate of the selector, wherein the second logic gate is coupled between the Schmitt trigger and the second device.

54. The method of claim 52, further comprising:
   driving the sense amplifier when the selection signal is below the threshold value with a first NOR-gate of the selector, wherein the first NOR-gate includes a first input which is coupled to an output of the Schmitt trigger and a second input coupled to a latch signal for the sense amplifier; and
   driving the sense amplifier when the selection signal is above the threshold value with a second NOR-gate of the selector, wherein the second NOR-gate includes a first input coupled to an inverted output of the Schmitt trigger and a second input coupled to the latch signal for the sense amplifier.

55. The method of claim 52, further comprising:
   driving the sense amplifier when the selection signal is below the threshold value with a first logic gate of the selector, wherein the first logic gate is coupled between the Schmitt trigger and the first device; and
   driving the sense amplifier when the selection signal is above the threshold value with a second logic gate of the selector, wherein the second logic gate is coupled between the Schmitt trigger and the second device.

56. The method of claim 52, wherein driving the sense amplifier with a first current level of a first device and driving the sense amplifier with a second current level of a second device comprises driving the sense amplifier with a first current level and a second current level of pull-down devices in an n-sense amplifier.

57. A driver for a sense amplifier comprising:
   a first pull-down device coupled to the sense amplifier;
   a second pull-down device coupled to the sense amplifier, the second pull-down device being responsive to a power supply voltage level; and
   a selector circuit coupled to the first and second pull-down devices.

58. The driver of claim 57, wherein the first and second pull-down devices comprise first and second n-channel transistors.

59. The driver of claim 58, wherein the first and second n-channel transistors have substantially the same width.

60. The driver of claim 58, wherein the first n-channel transistor is approximately twice as wide as the second n-channel transistor.

61. The driver of claim 57, wherein the selector circuit comprises a Schmitt trigger which compares a voltage level proportional to the supply voltage with a reference voltage and produces a signal that selects among the first and second pull-down devices to provide a selected current level for the sense amplifier.

62. The driver of claim 61, wherein the Schmitt trigger is coupled to a logic circuit that controls the first and second pull-down devices.

63. A driver for a sense amplifier comprising:

a first pull-down device coupled to the sense amplifier;

a second-pull-down device coupled to the sense amplifier, the second pull-down device being responsive to a power supply voltage level; and a selector circuit coupled to the first and second pull-down devices, comprising:
  a Schmitt trigger that produces a signal that selectively activates the first and second pull-down devices so as to produce an acceptable drive current level for the sense amplifier;
  a first logic gate coupled between the Schmitt trigger and the first pull-down device so as to drive the sense amplifier when the selection signal is below a threshold value of the Schmitt trigger; and
  a second logic gate coupled between the Schmitt trigger and the second pull-down device so as to drive the sense amplifier when the selection signal is above the threshold value.

64. The driver of claim 63, wherein the Schmitt trigger receives a selection signal that is proportional to the supply voltage and compares the selection signal with the threshold value of the Schmitt trigger.

65. The driver of claim 63, wherein:

the first logic gate comprises a NOR-gate having a first input coupled to an output of the Schmitt trigger and a second input coupled to a latch signal for the sense amplifier; and the second logic gate comprises a NOR-gate having a first input coupled to an inverted output of the Schmitt trigger and a second input coupled to the latch signal for the sense amplifier.

66. The driver of claim 63, wherein the first and second pull-down devices comprise n-channel MOS transistors that have substantially the same widths, a gate of each transistor coupled to receive a control signal from the selector circuit.

67. The driver of claim 63, wherein the first and second pull-down devices comprise n-channel MOS transistors that have different widths, a gate of each transistor coupled to receive a control signal from the selector circuit.

68. A sense amplifier for a memory device, the sense amplifier comprising:

first and second transistors that are cross-coupled between digit lines of the memory device;

a number of drive transistors coupled to the first and second cross-coupled transistors;

a voltage node that has a voltage level that is proportional to the voltage level of a power supply for the sense amplifier;

a selector circuit coupled to the first and second pull-down devices, comprising:
  a Schmitt trigger circuit having an input coupled to the voltage node, wherein the Schmitt trigger produces a signal that selectively activates the first and second pull-down devices so as to produce an acceptable drive current level for the sense amplifier;
  a first logic gate coupled between the Schmitt trigger and the first pull-down device so as to drive the sense amplifier when the selection signal is below a threshold value of the Schmitt trigger; and
  a second logic gate coupled between the Schmitt trigger and the second pull-down device so as to drive the sense amplifier when the selection signal is above the threshold value.

69. The sense amplifier of claim 68, wherein the first logic gate and the second logic gate each include an input which is coupled to a latch signal that selects when the control signals are applied to the drive transistors.

70. The sense amplifier of claim 68, wherein the drive transistors comprise n-channel MOS transistors.

71. The sense amplifier of claim 68, wherein the drive transistors have different widths.

72. The sense amplifier of claim 68, and further including:

first and second p-channel transistors that are cross-coupled between the digit lines;

a number of drive devices coupled to the p-channel transistors; and a selector coupled to the number of drive devices for selectively coupling the drive devices to the p-channel transistors based on the power supply voltage of the memory device so as to drive the p-channel transistors with a sufficient current level.

73. The sense amplifier of claim 68, wherein:

the first logic gate comprises a NOR-gate having a first input coupled to an output of the Schmitt trigger and a second input coupled to the latch signal for the sense amplifier; and the second logic gate comprises a NOR-gate having a first input coupled to an inverted output of the Schmitt trigger and a second input coupled to the latch signal for the sense amplifier.

74. The sense amplifier of claim 68, wherein the first and second pull-down devices comprise n-channel MOS transistors that have substantially the same widths, a gate of each transistor coupled to receive a control signal from the selector circuit.

75. The sense amplifier of claim 73, wherein the selector circuit further comprises an inverter coupled to the first input of the NOR-gate of the first logic gate, wherein the inverter produces a low logic value when the input to the Schmitt trigger exceeds the threshold value.

* * * * *